(12) United States Patent
Hirata et al.

(10) Patent No.: US 8,093,109 B2
(45) Date of Patent: Jan. 10, 2012

(54) METHOD FOR FORMING SEMICONDUCTOR THIN FILM AND METHOD FOR MANUFACTURING ELECTRONIC DEVICE

(75) Inventors: Shintaro Hirata, Kanagawa (JP); Daisuke Hobara, Kanagawa (JP)

(73) Assignee: Sony Corporation, Tokyo (JP)

( * ) Notice: Subject to any disclaimer, the term of this patent is extended or adjusted under 35 U.S.C. 154(b) by 149 days.

(21) Appl. No.: 12/565,935

(22) Filed: Sep. 24, 2009

(65) Prior Publication Data

US 2010/0081231 A1 Apr. 1, 2010

(30) Foreign Application Priority Data

Sep. 26, 2008 (JP) ................................ 2008-247636

(51) Int. Cl.
*H01L 21/84* (2006.01)
(52) U.S. Cl. ............ 438/151; 438/63; 438/158; 438/479
(58) Field of Classification Search .................... 438/63, 438/151
See application file for complete search history.

(56) References Cited

U.S. PATENT DOCUMENTS 7,432,126 B2 10/2008 Schmid
7,511,298 B2 3/2009 Kawaraya et al.

FOREIGN PATENT DOCUMENTS

| JP | 2004-515081 | 5/2004 |
| JP | 2005-173048 | 6/2005 |
| JP | 2007-149652 | 6/2007 |

OTHER PUBLICATIONS

Ridley, Brent "All-Inorganic Field Effect Transistors Fabricated by Printing" Oct. 22, 1999 Science vol. 286 pp. 746-749.*
Shenderova, O. "Nanodiamond and onion-like carbon polymer nanocomposites" Diamond and Related Materials 16 Apr./Jul. 2007 pp. 1213-1217.*

* cited by examiner

*Primary Examiner* — N Drew Richards
*Assistant Examiner* — Grant Withers
(74) *Attorney, Agent, or Firm* — K&L Gates LLP

(57) ABSTRACT

A method for forming a semiconductor thin film includes the steps of applying an inorganic semiconductor fine particle-dispersion solution on a substrate and drying the coating to form a semiconductor fine particle layer, and immersing the semiconductor fine particle layer in a solution to form a semiconductor thin film.

10 Claims, 9 Drawing Sheets

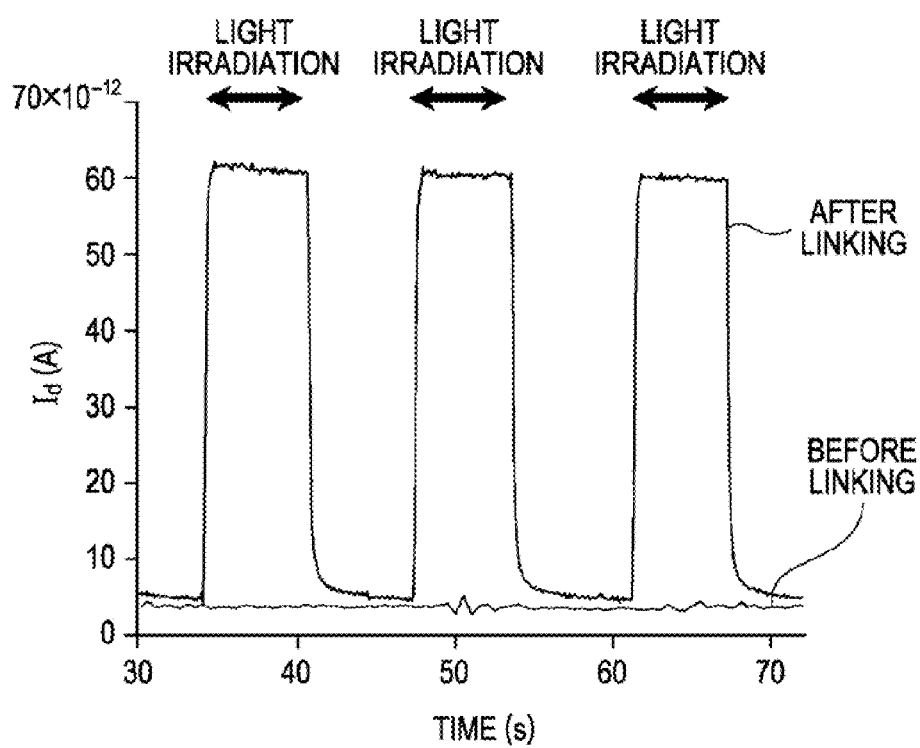

METHOD FOR FORMING SEMICONDUCTOR THIN FILM AND METHOD FOR MANUFACTURING ELECTRONIC DEVICE

CROSS REFERENCES TO RELATED APPLICATIONS

The present application claims priority to Japanese Priority Patent Application JP 2008-247636 filed in the Japan Patent Office on Sep. 26, 2008, the entire content of which is hereby incorporated by reference.

BACKGROUND

The present application relates to a method for forming a semiconductor thin film and a method for manufacturing an electronic device using the method for forming a semiconductor thin film.

In recent years, electronic devices using thin films of semiconductor fine particles have been vigorously developed, and in particular, electronic devices such as semiconductor devices, light-emitting devices, and solar cells have attracted attention. Ultimate goals of these electronic devices include low cost, light weight, flexibility, and high performance. It is said that the key to development lies in the physical properties of semiconductor thin films formed from semiconductor fine particles used as a starting material. Semiconductor thin films formed from semiconductor fine particles as a starting material have the following various advantages as compared with inorganic materials such as silicon.

(1) Large-area electronic devices can be manufactured by a simple process at low cost and low temperature.

(2) Electronic devices having flexibility can be manufactured.

(3) The performance and physical properties of electronic devices can be controlled by the semiconductor fine particles used.

In particular, as a low-temperature simple process, for example, Japanese Unexamined Patent Application Publication (Translation of PCT Application) No. 2004-515081 discloses a technique of forming a semiconductor layer composed of inorganic semiconductor particles by a coating deposition method such as a printing method.

SUMMARY

However, it has been found that it is difficult to form a semiconductor layer having desired characteristics and composed of inorganic semiconductor fine particles only by applying a disperse solution of inorganic semiconductor particles on a base to form a film and then simply drying the film.

It is desirable to provide a method for forming a semiconductor thin film having desired characteristics using inorganic semiconductor fine particles as a starting material, and a method for manufacturing an electronic device using the method for forming a semiconductor thin film.

According to an embodiment, a method for forming a semiconductor thin film includes (a) applying an inorganic semiconductor fine particle-dispersion solution on a substrate and drying the coating to form a semiconductor fine particle layer, and (b) immersing the semiconductor fine particle layer in a solution (also referred to herein as a "semiconductor thin film-forming solution") to form a semiconductor thin film.

According to a first embodiment, a method for manufacturing an electronic device is a method for manufacturing a three-terminal electronic device including (A) a control electrode, (B) a first electrode and a second electrode, and (C) an active layer composed of a semiconductor thin film and provided between the first electrode and the second electrode so as to face the control electrode through an insulating layer.

According to a second embodiment, a method for manufacturing an electronic device is a method for manufacturing a two-terminal electronic device including (A) a first electrode and a second electrode and (B) an active layer composed of a semiconductor thin film and provided between the first electrode and the second electrode.

In the method for manufacturing an electronic device according to the first or second embodiment, the semiconductor thin film is formed by the steps of (a) applying an inorganic semiconductor fine particle-dispersion solution on a substrate and drying the coating to form a semiconductor fine particle layer, and (b) immersing the semiconductor fine particle layer in a solution (also referred to herein as a "semiconductor thin film-forming solution").

In the three-terminal electronic device obtained by the method for manufacturing an electronic device according to the first embodiment, a current flowing through the active layer from the first electrode to the second electrode may be controlled by a voltage applied to the control electrode. Specifically, the electronic device may be configured as a field-effect transistor in which the control electrode corresponds to a gate electrode, the first and second electrodes correspond to source/drain electrodes, the insulating layer corresponds to a gate insulating layer, and the active layer corresponds to a channel-forming region. Alternatively, the electronic device may be configured as a light-emitting element (light-emitting transistor) in which the active layer emits light by applying a voltage to the control electrode and the first and second electrodes. In this light-emitting element, the semiconductor thin film constituting the active layer has the light-emitting function based on charge storage due to modulation based on the voltage applied to the control electrode and recombination of injected electrons and holes. In the light-emitting element (light-emitting transistor), emission intensity is proportional to the absolute value of a drain current and may be modulated by the gate voltage and the voltage between the source/drain electrodes. Whether the electronic device exhibits the function as a field-effect transistor or a light-emitting element depends on the state (bias) of voltage application to the first and second electrodes. First, when a bias is applied in a range in which electrons are not injected from the second electrode, a current flows from the first electrode to the second electrode by modulating the control electrode. This is a transistor operation. On the other hand, when bias applied to the first electrode and the second electrode is increased under a condition in which holes are, sufficiently stored, electron injection starts, and light is emitted by recombination with holes. Alternatively, the electronic device may be configured as a photoelectric transducer in which a current flow between the first electrode and the second electrode by irradiation of the active layer. When the electronic device is configured as a photoelectric transducer, specifically, a solar cell or image sensor may be configured according to the photoelectric transducer. In this case, a voltage may not be applied or may be applied to the control electrode. When a voltage is applied, a flowing current may be modulated by applying a voltage to the control electrode. When the electronic device is configured as a light-emitting element or a photoelectric transducer, more specifically, the configuration and structure of a light-emitting element or a photoelectric transducer may be, for example, the same as any of the configurations and structures of four types of field-effect transistors described below.

The two-terminal electronic device obtained by the method for manufacturing an electronic device according to the second embodiment, specifically, functions as a solar cell. In this case, the first electrode may be composed of a metal having high work function (for example, $\phi$=4.5 eV to 5.5 eV), and the second electrode may be composed of a metal having low work function (for example, $\phi$=3.5 eV to 4.5 eV). In this configuration, from the viewpoint of improving the efficiency of power generation, it is preferable to form a so-called vertical device structure in which the second electrode, the active layer, and the first electrode are formed in order on the substrate. The structure of the electronic device is not limited to the vertical structure, and a so-called horizontal structure may be formed, in which the first and second electrodes are formed on the substrate, and the active layer is formed on a portion of the substrate, which positions between the first and second electrodes. In these cases, when the semiconductor thin film has p-type conductivity, a conductive material having a work function relatively close to the energy level possessed by HOMO (Highest Occupied Molecular Orbital) of semiconductor atoms and semiconductor molecules which constitute the semiconductor thin film may be selected as a material constituting the first electrode. Examples of such a material include gold (Au) and silver (Ag), and ITO and STO which are used for forming a transparent electrode. In the electronic device obtained by the method for manufacturing an electronic device according to the first embodiment, when the photoelectric transducer as the electronic device is allowed to function as a solar cell, each of the first and second electrodes is preferably composed of the above-described material.

In the method for forming a semiconductor thin film in an embodiment, the method for manufacturing an electronic device according to the first embodiment including the above-described preferred form, or the method for manufacturing an electronic device according to the second embodiment, preferably, the inorganic semiconductor fine particles are composed of at least one material selected from the group consisting of lead selenide (PbSe), tin selenide (SnSe), germanium selenide (GeSe), cadmium selenide (CdSe), zinc selenide (ZnSe), lead sulfide (PbS), tin sulfide (SnS), germanium sulfide (GeS), cadmium sulfide (CdS), zinc sulfide (ZnS), lead telluride (PbTe), tin telluride (SnTe), germanium telluride (GeTe), cadmium telluride (CdTe), and zinc telluride (ZnTe). Also, inorganic semiconductor fine particles having a core-shell structure including a combination of these materials, a vesicle structure in which organic molecules are incorporated, or the like may be used.

In the method for forming a semiconductor thin film of an embodiment including the above-described preferred configuration, the method for manufacturing an electronic device according to a first embodiment including the above-described preferred form and configuration, or the method for manufacturing an electronic device according to a second embodiment including the above-described preferred form and configuration, the solution (semiconductor thin film forming solution) may be composed of an alcohol containing a dithiol compound. In this case, the dithiol compound is preferably composed of alkanedithiol, phenyldithiol, or thiophenedithiol.

The method for forming a semiconductor thin film including the above-described preferred form and configuration, the method the method for manufacturing an electronic device according to a first embodiment including the above-described preferred form and configuration, or the method for manufacturing an electronic device according to a second embodiment including the above-described preferred form and configuration.

In an embodiment, the inorganic semiconductor fine particle-dispersion solution is applied to the substrate, and any one of usual application methods may be used without problem. Specific examples of the application method include a spin coating method; various printing methods, such as a screen printing method, an ink jet printing method, an offset printing method, a reverse offset printing method, a gravure printing method, and a micro contact method; various coating methods, such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, a calender coater method, a capillary coater method, and a dipping method; a spray method; a method using a dispenser; a casting method; a stamp method; and a method of applying a liquid material, such as a Langmuir-Blodgett method. The number of times of application and drying of the inorganic semiconductor fine particle-dispersion solution on the substrate is not limited to one and may be a plural number such as two or more. In this case, a thick semiconductor fine particle layer (a semiconductor fine particle layer including inorganic semiconductor fine particles at a high density) is obtained so that the uniformity and thickness of the final resulting semiconductor thin film may be controlled. The drying temperature and time may be appropriately selected according to the boiling point of the inorganic semiconductor fine particle-dispersion solution used and the material used.

The inorganic semiconductor fine particle-dispersion solution is a solution (dispersion solution) in which the inorganic semiconductor fine particles are dispersed. Examples of such a dispersion solution include hexane/octane, dichloromethane, hexane, pentane, and octane.

In addition, the semiconductor fine particle layer is dipped in the semiconductor thin film-forming solution to form the semiconductor thin film. The dipping time depends on the type of the inorganic semiconductor fine particles constituting the semiconductor fine particle layer and the type of the semiconductor thin film-forming solution. Therefore, the dipping time may be appropriately determined on the basis of various tests. This applies to the other dipping conditions such as the temperature of the semiconductor thin film-forming solution, and the like. After dipping, drying is performed for removing the semiconductor thin film-forming solution. The drying temperature and time may be appropriately selected according to the boiling point of the semiconductor thin film-forming solution used and the material used.

The semiconductor fine particle layer is formed on the substrate, and the semiconductor fine particle layer on the substrate may be formed in a state in which the inorganic semiconductor fine particles are densely or roughly contained. Specifically, a projective image obtained by projecting the semiconductor fine particle layer vertically to the substrate preferably has a ratio $OR_1$ of 80% or more per unit area of the substrate. Namely, the value of $(100-OR_1)$ represents the ratio of absence of the inorganic semiconductor fine particles on the substrate. When the semiconductor fine particle layer is formed several times on the substrate, a projective image obtained by projecting the final resulting semiconductor fine particle layer preferably has a ratio $OR_1$ of 80% or more per unit area of the substrate. The semiconductor fine particle layer is dipped in the semiconductor thin film-forming solution to form the semiconductor thin film. Specifically, a projective image obtained by projecting the semiconductor thin film vertically to the substrate preferably has a ratio $OR_2$ of 95% or more per unit area of the substrate. Namely, the value of (100−OR$_2$) represents the ratio of absence of the semiconductor thin film on the substrate. However, preferably, an island-like semiconductor thin film (a portion separated from the other semiconductor thin film portion and independently present) is not present in the semiconductor thin film on the substrate.

The average particle diameter R$_{AVE}$ range of the inorganic semiconductor fine particles is not limited but is preferably $1 \times 10^{-9}$ m $\leq$ R$_{AVE}$ $\leq$ $1 \times 10^{-6}$ m, more preferably $1 \times 10^{-9}$ m $\leq$ R$_{AVE}$ $\leq$ $1 \times 10^{-8}$ m. The shape of the inorganic semiconductor fine particles may be a spherical shape but is not limited to this. Other examples of the shape include a triangle, a tetrahedron, a cube, a rectangular parallelepiped, a cone, a cylinder (rod), a triangular prism, a fibrous shape, a pill-like fiber, and the like. When the shape of the inorganic semiconductor fine particles is not a spherical shape, spheres having the same volume as that measured for the inorganic semiconductor fine particles having a shape other than a spherical shape are estimated, and the average diameter of the spheres may be considered as the average particle diameter R$_{AVE}$ of the inorganic semiconductor fine particles. The average particle diameter R$_{AVE}$ of the inorganic semiconductor fine particles may be determined by, for example, measuring the diameters of the inorganic semiconductor fine particles observed through a transmission electron microscope (TEM).

In addition, protective layers may be formed on the surfaces of the semiconductor fine particles. Example of a material constituting the protective layers include trioctylphosphine (TOP), trioctylphosphine oxide (TOPO), oleylamine, and oleic acid. However, the material is not limited to these materials, and any material may be used as long as it is a molecule (material) having a functional group which may be bonded to semiconductor fine particles.

The three-terminal electronic device obtained by the method for manufacturing an electronic device according to a first embodiment including the above-described preferred form and configuration may have any structure as long as it is a structure in which the semiconductor thin film may be formed, such as a bottom contact-type semiconductor device, a top contact-type semiconductor device, a semiconductor device having a vertical structure, or the like.

The method for manufacturing an electronic device according to a first embodiment including the above-described preferred form and configuration is capable of manufacturing a bottom gate/bottom contact-type semiconductor device. Specifically, the method includes the steps of:

(a) forming a gate electrode on a support and then forming a gate insulating layer over the entire surface;

(b) forming source/drain electrodes on the gate insulating layer; and (c) applying and drying an inorganic semiconductor fine particle-dispersion solution on at least a portion of the gate insulating layer (corresponding to the substrate) which positions between the source and drain electrodes to form a semiconductor fine particle layer, and then dipping the semiconductor fine particle layer in a semiconductor thin film-forming solution to form a channel-forming region including a semiconductor thin film.

The resulting bottom gate/bottom contact-type semiconductor device (specifically, a bottom gate/bottom contact-type field-effect transistor FET, more specifically, a bottom gate/bottom contact-type thin film transistor TFT) includes:

(α) a gate electrode formed on a support;

(β) a gate insulating layer (corresponding to a substrate) formed on the gate electrode and the support;

(γ) source/drain electrodes formed on the gate insulating layer; and (δ) a channel-forming region including a semiconductor thin film formed between the source and drain electrodes on the gate insulating layer.

The method for manufacturing an electronic device according to a first embodiment including the above-described preferred form and configuration is capable of manufacturing a bottom gate/top contact-type semiconductor device. Specifically, the method includes:

(a) forming a gate electrode on a support and then forming a gate insulating layer over the entire surface;

(b) applying and drying an inorganic semiconductor fine particle-dispersion solution on the gate insulating layer (corresponding to the substrate) to form a semiconductor fine particle layer, and then immersing the semiconductor fine particle layer in a semiconductor thin film-forming solution to form a channel-forming region and channel-forming region extension including a semiconductor thin film; and (c) forming source/drain electrodes on the channel-forming region extension.

The resulting bottom gate/top contact-type semiconductor device (specifically, a bottom gate/top contact-type field-effect transistor FET, more specifically, a bottom gate/top contact-type thin film transistor TFT) includes the following members:

(α) a gate electrode formed on a support;

(β) a gate insulating layer (corresponding to a substrate) formed on the gate electrode and the support;

(γ) a channel-forming region and a channel-forming region extension including a semiconductor thin film formed on the gate insulating layer; and (δ) source/drain electrodes formed on the channel-forming region extension.

The method for manufacturing an electronic device according to a first embodiment including the above-described preferred form and configuration is capable of manufacturing a top gate/bottom contact-type semiconductor device. Specifically, the method includes:

(a) forming source/drain electrodes on a support;

(b) applying and drying an inorganic semiconductor fine particle-dispersion solution on the support and the source/drain electrodes (corresponding to a substrate) to form a semiconductor fine particle layer, and then immersing the semiconductor fine particle layer in a semiconductor thin film-forming solution to form a channel-forming region including a semiconductor thin film; and (c) forming a gate insulating layer over the entire surface and then forming a gate electrode on a portion of the gate insulating layer, which is disposed on the channel-forming region.

The resulting top gate/bottom contact-type semiconductor device (specifically, a top gate/bottom contact-type field-effect transistor FET, more specifically, a top gate/bottom contact-type thin film transistor TFT) includes:

(α) source/drain electrodes formed on a support;

(β) a channel-forming region including a semiconductor thin film formed between the source and drain electrodes on the support (corresponding to a substrate);

(γ) a gate insulating layer formed on the source/drain electrodes and the channel-forming region; and (δ) a gate electrode formed on the gate insulating layer.

The method for manufacturing an electronic device according to a first embodiment including the above-described preferred form and configuration is capable of manufacturing a top gate/top contact-type semiconductor device. Specifically, the method includes:

(a) applying and drying an inorganic semiconductor fine particle-dispersion solution on a support (corresponding to a substrate) to form a semiconductor fine particle layer, and then immersing the semiconductor fine particle layer in a semiconductor thin film-forming solution to form a channel-forming region and channel-forming region extension including a semiconductor thin film;

(b) forming source/drain electrodes on the channel-forming region extension; and (c) forming a gate insulating layer over the entire surface and then forming a gate electrode on a portion of the gate insulating layer, which is disposed on the channel-forming region.

The resulting top gate/top contact-type semiconductor device (specifically, a top gate/top contact-type field-effect transistor FET, more specifically, a top gate/top contact-type thin film transistor TFT) includes the following members:

($\alpha$) a channel-forming region and a channel-forming region extension including a semiconductor thin film formed on a support (corresponding to a substrate);

($\beta$) source/drain electrodes formed on the channel-forming region extension;

($\gamma$) a gate insulating layer formed on the source/drain electrodes and the channel-forming region; and ($\delta$) a gate electrode forming on the gate insulating layer.

The substrate may be composed of a silicon oxide material (for example, $SiO_X$ or spin-on-glass (SOG)), silicon nitride ($SiN_Y$); silicon oxynitride (SiON), aluminum oxide ($Al_2O_3$); a metal oxide high-dielectric insulating film, or a metal salt insulator. When the substrate is composed of such a material, the substrate may be formed on a support (or above a support) composed of a material appropriately selected from the materials given below. Examples of the material for the support or a substrate other than the above-described substrate include organic polymers (polymer material forms such as plastic films, plastic sheets, and plastic substrates having flexibility and composed of polymer materials), such as polymethyl methacrylate (PMMA), polyvinyl alcohol (PVA), polyvinyl phenol (PVP), polyethersulfone (PES), polyimide, polycarbonate (PC), polyethylene terephthalate (PET), and polyethylene naphthalate (PEN); and natural mineral insulators such as mica and the like. When the substrate composed or such an organic polymer or polymer material having flexibility is used, the electronic device or semiconductor device may be incorporated into or integrated with, for example, a display device or an electronic apparatus having a curved surface shape. Examples of the substrate (or the support) include various glass substrates, various glass substrates including insulating films formed on the surfaces thereof, a quartz substrate, a quartz substrate including an insulating film formed a surface thereof, a silicon substrate including an insulating film formed a surface thereof, a sapphire substrate, and metal substrates composed of various alloys or metals, such as a stainless steel substrate and the like. As an electrical insulating support, a proper material may be selected from the above-described materials. As the support, a conductive substrate (a substrate composed of a metal such as gold or aluminum, a substrate composed of high-orientation graphite, a stainless steel substrate, or the like) may be used. The electronic device is provided on a support according to the configuration and structure of the electronic device. The support may be composed of the above-described material. Although a surface of the substrate preferably has smoothness, it may have a degree of roughness which does not influence the conductivity of the semiconductor thin film. In order to improve the adhesion between the substrate and the semiconductor thin film, a silanol dielectric layer may be formed on a surface of the substrate by a silane coupling method. Alternatively, a substrate partially surface-treated to have affinity with the inorganic semiconductor fine particles may be prepared, and the inorganic semiconductor fine particle-dispersion solution may be applied and dried on the substrate to finally easily prepare a patterned semiconductor thin film. As surface treatment with high affinity with the inorganic semiconductor fine particles, for example, molecules having functional groups which may be bonded to the semiconductor fine particles, such as thiol groups, phosphate groups, carbonyl groups, or the like, may be adhered and adsorbed on a portion of the substrate.

Examples of materials constituting the control electrode, the first electrode, the second electrode, the gate electrode, and the source/drain electrodes include metals such as platinum (Pt), gold (Au), palladium (Pd), chromium (Cr), molybdenum (Mo), nickel (Ni), aluminum (Al), silver (Ag), tantalum (Ta), tungsten (W), copper (Cu), titanium (Ti), indium (In), tin (Sn), iron (Fe), cobalt (Co), zinc (Zn), magnesium (Mg), and the like; alloys containing these metal elements; conductive particles composed of these metals; conductive particles of alloys containing these metals; and conductive materials such as impurity-containing polysilicon and carbonaceous materials. A laminated structure of layers containing these elements may be formed. Further examples of materials constituting the control electrode, the first electrode, the second electrode, the gate electrode, and the source/drain electrodes include organic materials (conductive polymer) such as poly(3,4-ethylenedioxythiophene)/polystyrenesulfonic acid [PEDOT/PSS] and polyaniline. The materials constituting the control electrode, the first electrode, the second electrode, the gate electrode, and the source/drain electrodes may be the same or different.

The method forming the control electrode, the first electrode, the second electrode, the gate electrode, and the source/drain electrodes depends on the constituent materials but may be a combination of a patterning technique according to demand and any one of the above-described various coating methods; a physical vapor deposition method (PVD method); various chemical vapor deposition methods (CVD method) including a MOCVD method; a lift-off method; a shadow mask method; and plating methods, such as an electroplating method, an electroless plating method, and combination thereof. Examples of the PVD method include (a) various vacuum evaporation methods, such as an electron beam heating method, a resistance heating method, a flash evaporation method, a method of heating a crucible, and the like; (b) a plasma evaporation method; and (c) various sputtering methods, such as a double-pole sputtering method, a direct-current sputtering method, a direct-current magnetron sputtering method, a high-frequency sputtering method, a magnetron sputtering method, an ion beam sputtering method, a bias sputtering method, and the like; and (d) various ion plating methods, such as a DC (direct current) method, a RF method, a multi-cathode method, an activation reaction method, a field evaporation method, a high-frequency ion plating method, a reactive ion plating method, and the like.

Examples of a material constituting the gate insulating layer include inorganic insulating materials, for example, silicon oxide-based materials; silicon nitride ($SiN_Y$); metal oxide high-dielectric insulating films of aluminum oxide ($Al_2O_3$), and the like; organic insulating materials, for example, polymethyl methacrylate (PMMA); polyvinyl phenol (PVP); polyvinyl alcohol (PVA); polyimide; polycarbonate (PC); polyethylene terephthalate (PET); polystyrene; silanol derivatives (silane coupling agent) such as N-2-(aminoethyl)-3-aminopropyl trimethoxysilane (AEAPTMS), 3-mercaptoproply trimethoxysilane (MPTMS), octadecyl trichlorosilane (OTS), and the like; linear hydrocarbons each having, at an end, a functional group which can be bonded to the control electrode, for example, organic insulating materials (organic polymers), such as octadecane thiol, dodecyl isocyanate, and the like; and combinations these materials. Examples of the silicon oxide-based materials include silicon oxide ($SiO_X$), BPSG, PSG, BSG, AsSG, PbSG, silicon oxynitride (SiON), SOG (spin-on glass), and low-dielectric materials (for example, polyaryl ether, cycloperfluorocarbon polymer, benzocyclobutene, cyclic fluorocarbon resins, polytetrafluoroethylene, fluoroaryl ether, polyfluoroimide, amorphous carbon, and organic SOG).

As the method for forming the gate insulating layer, any one of the above-described various PVD methods, various CVD methods, a spin coating method, the above-described various printing methods, the above-described various coating methods, a dipping method; a casting method, a sol-gel method, an electrodeposition method, a shadow mask method, and a spray method may be used.

The gate insulating layer may be formed by oxidizing or nitriding the surfaces of the control electrode and the gate electrode or forming an oxide film or nitride film on the surfaces of the control electrode and the gate electrode. The method for oxidizing the surfaces of the control electrode and the gate electrode depends on the materials constituting the control electrode and the gate electrode, but, for example, an oxidizing method using $O_2$ plasma or an anodization method may be used. The method for nitriding the surfaces of the control electrode and the gate electrode depends on the materials constituting the control electrode and the gate electrode, but, for example, a nitriding method using $N_2$ plasma may be used. Alternatively, the gate insulating layer may be formed on the surfaces of the control electrode and the gate electrode by a method such as a dipping method for coating, in a self-organizing manner, the surfaces of the control electrode and the gate electrode with insulating molecules having functional groups which may be chemically bonded to the control electrode and the gate electrode. The gate insulating layer may be formed by modifying the surfaces of the control electrode and the gate electrode with a silanol derivative (silane coupling agent).

When the electronic device obtained in an embodiment is applied to a display device and various electronic apparatuses, many electronic devices may be integrated on a support to form a monolithic integrated circuit, or electronic devices may be cut into individual devices and used as discrete components. In addition, the electronic device may be sealed with a resin.

According to an embodiment, although a mechanism is not elucidated yet, a semiconductor thin film may be formed by not only applying and drying an inorganic semiconductor fine particle-dispersion solution on a substrate to form a semiconductor fine particle layer, but also immersing the semiconductor fine particle layer in a solution. As a result, a semiconductor thin film having desired characteristics may be formed at low cost by a simple convenient wet process using inorganic semiconductor fine particles as a starting material, thereby providing an electronic device having desired characteristics. The process for forming the semiconductor thin film has no large limit to the shapes and materials of the substrate and the support, and thus desired semiconductor thin films may be formed on various substrates. Therefore, an electronic device such as a transistor, a light-emitting element, or a solar cell may be formed on any one of various supports by a simple process.

Additional features and advantages are described herein, and will be apparent from the following Detailed Description and the figures.

BRIEF DESCRIPTION OF THE FIGURES

FIG. 8 is a graph showing photoresponsivity of a photoelectric conversion device before and after introduction of linker molecules obtained by a method of a reference example of manufacture of a photoelectric conversion device (before and after dipping in an acetonitrile solution of propanedithiol).

DETAILED DESCRIPTION

The present application is described in detail below with reference to the drawings according to an embodiment.

Example 1

Example 1 relates to a method for forming a semiconductor thin film of an embodiment and a method for manufacturing an electronic device according to a first embodiment.

Figure 1A:
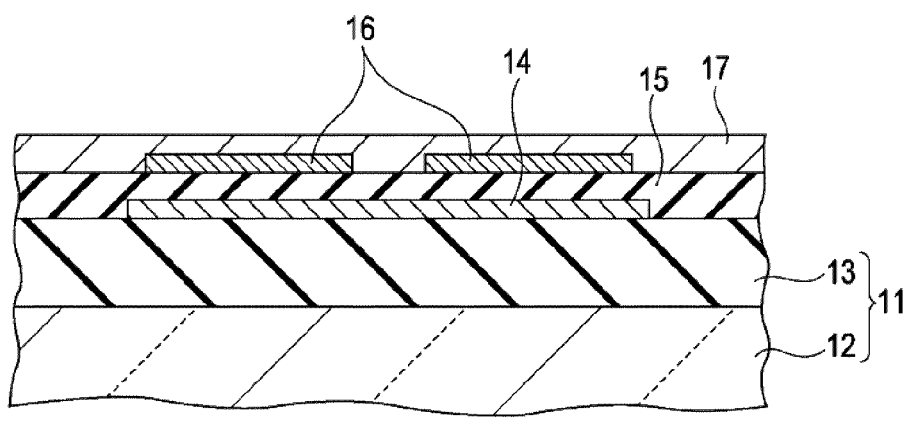
FIGS. 1A and 1B are schematic partial sectional views of electronic devices (semiconductor devices) of Example 1 and Example 2, respectively.

As shown in a schematic partial sectional view of FIG. 1A, an electronic device obtained by the method for manufacturing an electronic device of Example 1 is a three-terminal electronic device including the following members:

(A) a control electrode 14;
(B) first and second electrodes 16; and
(C) an active layer 17 including a semiconductor thin film provided to face the control electrode 14 through an insulating layer 15 between the first and second electrodes 16.

More specifically, the electronic device of Example 1 is a field-effect transistor (TFT) in which a current flowing through the active layer from the first electrode to the second electrode is controlled by the voltage applied to the control electrode. In addition, the control electrode corresponds to a gate electrode, the first and second electrodes correspond to source/drain electrodes, the insulating layer corresponds to a gate insulating layer, and the active layer corresponds to a channel-forming region.

The electronic device of Example 1 includes the gate electrode 14, the gate insulating layer 15, the source/drain electrodes 16, and the channel-forming region 17, which are provided on a support 11. Specifically, the electronic device of Example 1 is a bottom gate/bottom contact-type field effect transistor (more specifically, a thin film transistor (TFT)). Namely, the electronic device includes the following members:

(α) the gate electrode 14 (corresponding to the control electrode) formed on the support 11;

(β) the gate insulating layer 15 (corresponding to the insulating layer and to a substrate) formed on the gate electrode 14 and the support 11;

(γ) the source/drain electrodes 16 (corresponding to the first and second electrodes) formed on the gate insulating layer 15; and (δ) the channel-forming region 17 (corresponding to the active layer) including a semiconductor thin film formed between the source and drain electrodes 16 on the gate insulating layer 15.

In Example 1, the control electrode (gate electrode) 14 and the first and second electrodes (source/drain electrodes) 16 are composed of gold (Au), the insulating layer (gate insulating layer) 15 is composed of $SiO_2$, and the active layer (channel-forming region) 17 is composed of a semiconductor thin film formed from inorganic semiconductor fine particles composed of PbSe and used as a starting material. In other words, in Example 1, the inorganic semiconductor fine particles are composed of lead selenide (PbSe). The average particle diameter $R_{AVE}$ of the inorganic semiconductor fine particles is 10 nm. The solution (semiconductor thin film-forming solution) is an alcohol containing a dithiol compound, specifically an alcohol containing alkanedithiol, more specifically an ethyl alcohol solution of propanedithiol. In Example 1, the support 11 includes a glass substrate 12 and an insulating film 13 formed on a surface thereof.

In Example 1, first, PbSe fine particles were prepared by the scheme described below. All processes described below were performed in an argon gas environment. The PbSe fine particles used in Examples 2 to 6 were prepared by the same process.

Step-10

First, $Pb(Ac)_2$ trihydrate, diphenyl ether (DPE), oleic acid, and trioctylphosphine (TOP) were mixed in a two-necked eggplant-type flask, and the resultant mixture was heated at 100° C. to 120° C. for 2 hours under vacuuming. Then, the temperature of the solution was decreased to room temperature.

Step-20

Next, 10 milliliter of the solution prepared in Step-10 was placed in a two-necked eggplant-type flask and heated to 180° C. Then, part of a 1 mole solution of selenium (Se) in TOP was poured into the two-necked eggplant-type flask, and the resultant mixture was rapidly mixed. Then, the remaining solution was quickly poured into the two-necked eggplant-type flask. At this time, the solution was changed to black color. Then, the reaction temperature was rapidly decreased from 180° C. to 135° C., followed by reaction for 10 minutes. Then, the two-necked eggplant-type flask was placed in an ice bath to terminate the reaction, obtaining a product.

Step-30

Then, the resulting product was placed in a centrifugal tube, and a small amount of butanol was added thereto. Then, centrifugation was performed at 25° C. and 20,000 G for 20 minutes. Then, a transparent solution was removed, and nano particles were re-dispersed in toluene, and a small amount of butanol was added thereto. Then, centrifugation was performed at 0° C. and 20,000 G for 1 hour. After the centrifugation, a transparent solution was again separated from nano particles, and the nano particles were dispersed n a dispersion solution containing hexane and octane (9:1) to prepare an inorganic semiconductor fine particle-dispersion solution. The resulting inorganic semiconductor fine particle-dispersion solution was a hexane/octane (9:1) solution in which about 1% by weight of inorganic semiconductor fine particles composed of PbSe and having TOP protective layers formed on the surfaces were dispersed.

On the basis of the resulting inorganic semiconductor fine particles, a semiconductor thin film was formed by the method described below, and an electronic device (semiconductor device) was manufactured. In the description below, for convenience sake, the control electrode and the gate electrode are generically named "the gate electrode", the first and second electrodes and the source/drain electrodes are generically named "the source/drain electrodes", the insulating layer and the gate insulating layer are generically named "the gate insulating layer", and the active layer and the channel-forming region are generically named "the channel-forming region".

Step-100

First, the gate electrode 14 was formed on the support 11. Specifically, a resist layer (not shown) including a portion removed for forming the gate electrode 14 was formed on the insulating film 13 composed of $SiO_2$ and formed on a surface of the glass substrate 12 on the basis of lithography technique. Then, a titanium (Ti) layer (not shown) as an adhesion layer and a gold (Au) layer as the gate electrode 14 were deposited in order over the entire surface by the vacuum evaporation method, and then the resist layer was removed. As a result, the gate electrode 14 was formed on the basis of a so-called lift-off method.

Step-110

Next, the gate insulating layer 15 was formed over the entire surface, specifically, the support 11 including the gate electrode 14 (more specifically, the insulating film 13 formed on a surface of the glass substrate 12). Specifically, the gate insulating layer 15 composed of $SiO_2$ was formed on the gate electrode 14 and the insulating film 13 on the basis of a sputtering method. When the gate insulating layer 15 is deposited, a portion of the gate electrode 14 may be covered with a hard mask in order to permit formation of an output portion (not shown) of the gate electrode 14 without a photolithography process.

Step-120

Then, the source/drain electrodes 16 composed of a gold (Au) layer were formed on the gate insulating layer 15. Specifically, a titanium (Ti) layer (not shown) as an adhesion layer having a thickness of about 0.5 nm and a gold (Au) layer as the source/drain electrodes 16 having a thickness of about 25 nm were formed in order by the vacuum evaporation method. When the these layers are deposited, a portion of the gate insulating layer 15 may be covered with a hard mask in order to permit formation of the source/drain electrodes 16 without a photolithography process.

Step-130

Next, the inorganic semiconductor fine particle-dispersion solution was applied and dried on at least a portion of the gate insulating layer 15 (corresponding to the substrate), which positioned between the source/drain electrodes 16. Specifically, the inorganic semiconductor fine particle-dispersion solution prepared in Step-30, i.e., the dispersion solution including hexane/octane (9:1) in which inorganic semiconductor fine particles composed of PbSe and having TOP protective layers formed on the surfaces were dispersed, was applied to the substrate (specifically, the gate insulating layer 15 and the source/drain electrodes 16) on the basis of the casting method and then dried at 22° C. for 10 minutes to form a semiconductor fine particle layer having a thickness of 10 nm to 20 nm.

Step-140

Then, the semiconductor fine particle layer was immersed in a solution (semiconductor thin film-forming solution) to form the channel-forming region 17 (active layer) including a semiconductor thin film. Specifically, the whole of the support 17 including the semiconductor fine particle layer was immersed in an ethyl alcohol solution of propanedithiol at 22° C. for 24 hours to form the channel-forming region 17 (active layer) including a semiconductor thin film. Then, the semiconductor thin film-forming solution was removed by drying at 22° C. for 10 minutes.

Step-150

Finally, a passivation film (not shown) was formed over the entire surface to produce bottom gate/bottom contact-type FET (specifically, TFT).

In the three-terminal electronic device of Example 1 (specifically, bottom gate/bottom contact-type TFT), the gate voltage dependence of a current/voltage curve between the source/drain electrodes was measured. As a result, a saturation phenomenon of drain current with increases in drain voltage was observed, and thus an operation as a transistor was confirmed.

On the other hand, in the same step as Step-140 of Example 1, the whole of the support 11 including the semiconductor fine particle layer was immersed in an ethyl alcohol solution (not containing propanedithiol) at the same temperature for the same time as in Example 1 to form the channel-forming region 17 (active layer) including a semiconductor thin film. Then, ethyl alcohol was removed by drying under the same conditions as in Example 1. In the resultant bottom gate/bottom contact-type TFT of Comparative Example A, an operation as a transistor was not confirmed. In addition, in a bottom gate/bottom contact-type TFT of Comparative Example B which was produced through Step-130 and then Step-150 without Step-140, an operation as a transistor was not confirmed.

Figure 5:
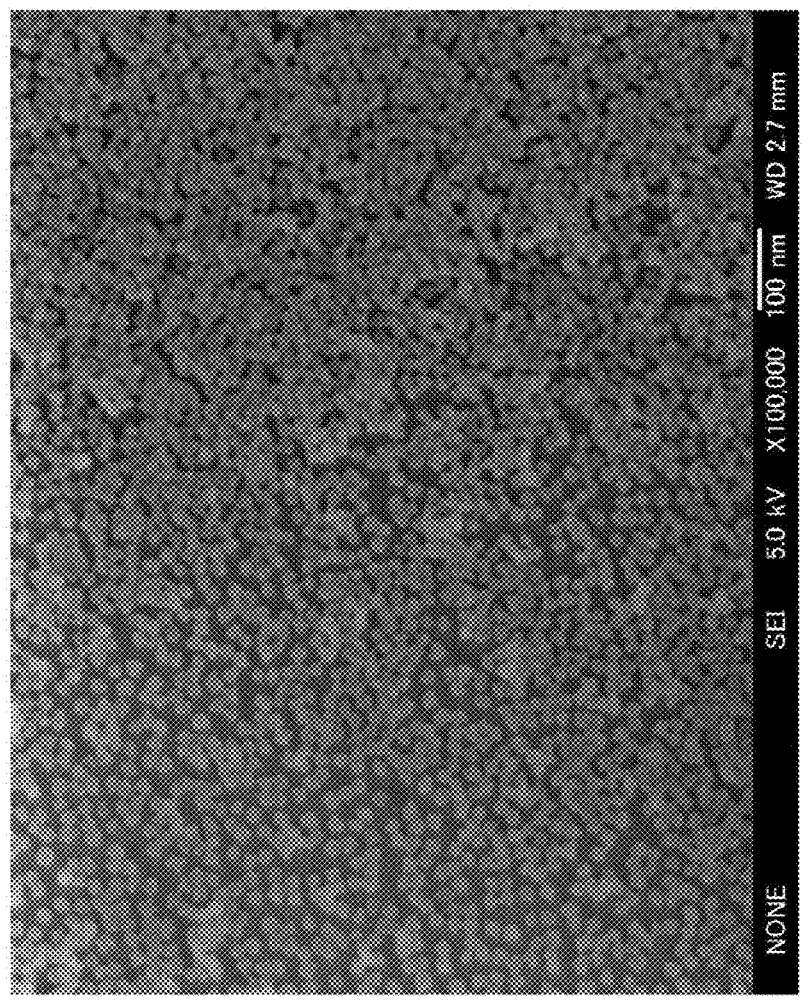
FIG. 5 is a drawing alternative to a scanning electron microscope photograph of a semiconductor fine particle layer obtained in Example 1.
Figure 6:
FIG. 6 is a drawing alternative to a scanning electron microscope photograph of a semiconductor thin film obtained in Example 1.

In order to confirm Step-130 and Step-140, the inorganic semiconductor fine particle-dispersion solution prepared in Step-30 was applied, on the basis of the casting method, to a SiO$_2$ layer formed on a surface of a silicon semiconductor substrate and then dried under the same conditions as in Step-130 to form a semiconductor fine particle layer. A scanning electron microscope photograph of the semiconductor fine particle layer is shown in FIG. 5. The semiconductor fine particle layer is composed of an assembly of innumerable inorganic semiconductor fine particles. Then, the resultant semiconductor fine particle layer was immersed in the semiconductor thin film-forming solution to form a semiconductor thin film by the same method as in Step-140. A scanning electron microscope photograph of the semiconductor thin film is shown in FIG. 6. In FIG. 6, an island-like semiconductor thin film extends from the right side to the center of the photograph. Although a mechanism is not elucidated yet, it is obvious that a semiconductor thin film is formed only by immersing the semiconductor fine particle layer in the solution.

Figure 7A:
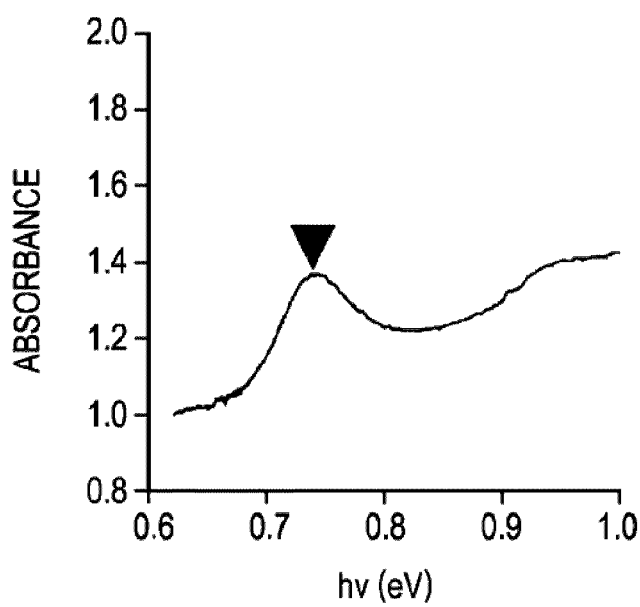
FIGS. 7A to 7D are graphs each showing the results of measurement of an absorption spectrum of a semiconductor thin film formed by immersing a semiconductor fine particle layer in a solution (semiconductor thin film-forming solution)
Figure 7B:
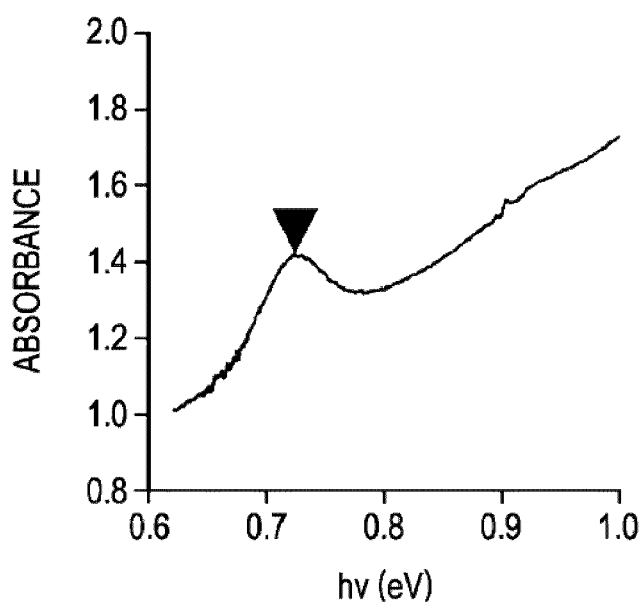
Figure 7C:
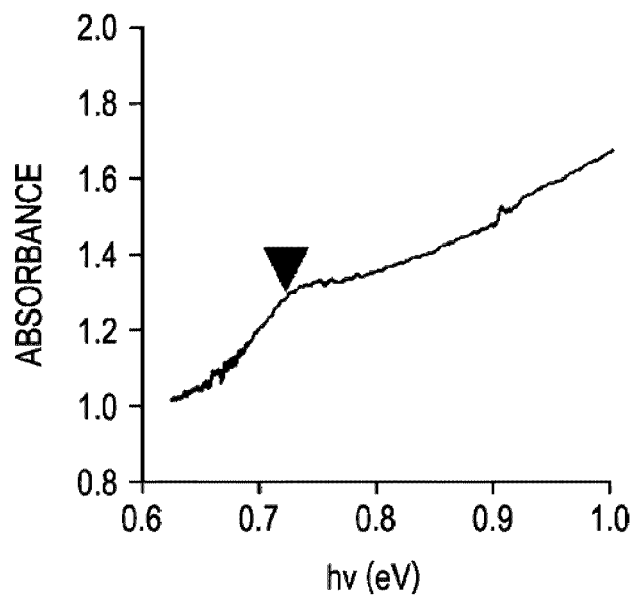
Figure 7D:
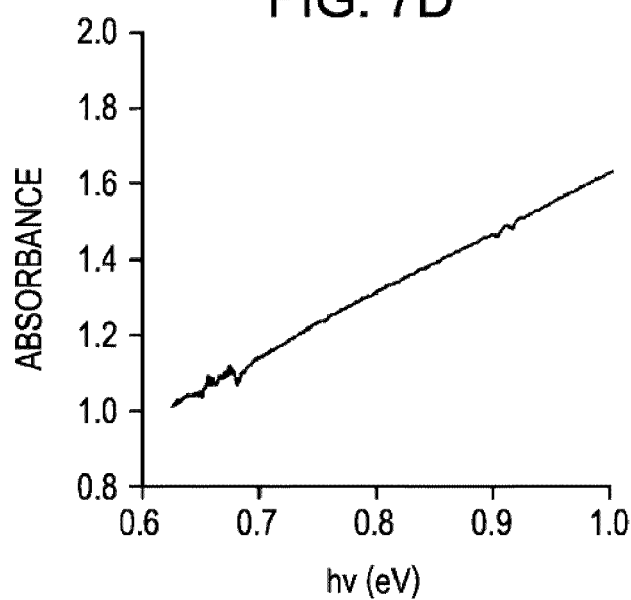

In addition, the inorganic semiconductor fine particle-dispersion solution prepared in Step-30 was applied, on the basis of the casting method, to a glass substrate and then dried under the same conditions as in Step-130 to form a semiconductor fine particle layer. The glass substrate was immersed in a solution (semiconductor thin film-forming solution) by the same method as in Step-140 to form a semiconductor thin film. The immersion time was changed to prepare samples (a total four types of samples prepared by immersion for 0 hour (without immersion) and immersion for 1 hour, 3 hours, and 19 hours), and an absorption spectrum of each sample was measured. The results are shown in FIGS. 7A to 7D. FIG. 7A shows the results of measurement of an absorption spectrum with an immersion time of 0 hours, i.e., without immersion. FIG. 7B shows the results of measurement of an absorption spectrum with an immersion time of 1 hour. FIG. 7C shows the results of measurement of an absorption spectrum with an immersion time of 3 hours. FIG. 7D shows the results of measurement of an absorption spectrum with an immersion time of 19 hours. In the sample without immersion (refer to FIG. 7A), an absorption peak based on the quantization level due to the zero-dimensional structure of PbSe fine particles is observed. On the other hand, with respect to the samples immersed, it is confirmed that an absorption peak based on the quantization level decreases as the immersion time increases (refer to FIGS. 7B, C, and D), and the position of the absorption peak shifts to the low energy side. This indicates that the semiconductor fine particle layer is changed to a semiconductor thin film by immersion in the semiconductor thin film-forming solution. That is, this indicates that a thin film of the semiconductor fine particles is formed, and the semiconductor fine particles come close to a bulk state.

In Example 1, the semiconductor thin film is formed by not only applying and drying the inorganic semiconductor fine particle-dispersion solution on the substrate to form the semiconductor fine particle layer, but also immersing the semiconductor fine particle layer in the solution. Therefore, a semiconductor thin film having desired characteristics is formed at low cost by a simple convenient wet process using the inorganic semiconductor fine particles as a starting material, and an electronic device having desired characteristics is provided.

Example 2

Figure 1B:
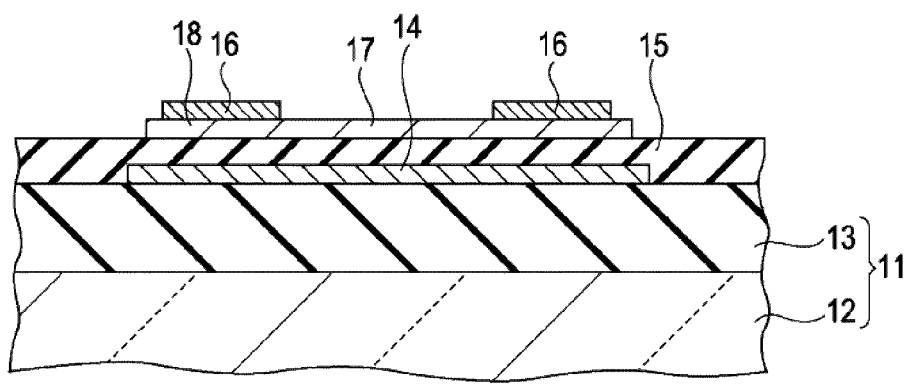

Example 2 is a modification of Example 1. In Example 2, an electronic device is bottom gate/top contact-type FET (specifically, TFT). As shown in a schematic partial sectional view of FIG. 1B, a field-effect transistor of Example 2 includes the following members:

(α) a gate electrode 14 (corresponding to the control electrode) formed on a support 11;

(β) a gate insulating layer 15 (corresponding to the insulating layer and to the substrate) formed on the gate electrode 14 and the support 11;

(γ) a channel-forming region 17 (corresponding to the active layer) and a channel-forming region extension 18 including a semiconductor thin film formed on the gate insulating layer 15; and (δ) source/drain electrodes 16 (corresponding to the first and second electrodes) formed on the channel-forming region extension 18.

Outlines of the method for manufacturing an electronic device (semiconductor device) of Example 2 are described below.

Step-200

First, the gate electrode 14 is formed on the support 11 by the same method as in Step-100 of Example 1. Then, the gate insulating layer 15 is formed over the entire surface, specifically the support 11 (more specifically, the insulating film 13) including the gate electrode 14 by the same method as in Step-110 of Example 1.

Step-210

Next, an inorganic semiconductor fine particle-dispersion solution is applied and dried on the substrate (specifically, the gate insulating layer 15) to form a semiconductor fine particle layer by the same method as in Step-130 to Step-140. Then, the semiconductor fine particle layer is immersed in a solution (semiconductor thin film-forming solution) to form the channel-forming region 17 and the channel-forming region extension 18 including a semiconductor thin film.
Step-220

Then, the source/drain electrodes 16 are formed on the channel-forming region extension 18 so as to sandwich the channel-forming region 17. Specifically, a titanium (Ti) layer (not shown) as an adhesion layer and a gold (Au) layer as the source/drain electrodes 16 are formed in order on the basis of the vacuum evaporation method by the same method as in Step-120 of Example 1. When the these layers are deposited, a portion of the channel-forming region extension 18 may be covered with a hard mask in order to permit formation of the source/drain electrodes 16 without a photolithography process.
Step-230

Finally, a passivation film (not shown) is formed over the entire surface to complete an electronic device of Example 2.

Example 3

Figure 2A:
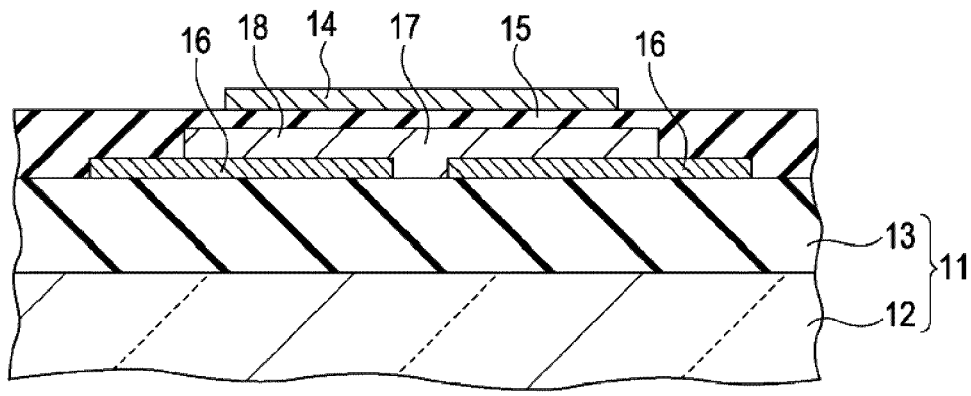
FIGS. 2A and 2B are schematic partial sectional views of electronic devices (semiconductor devices) of Example 3 and Example 4, respectively.

Example 3 is also a modification of Example 1. In Example 3, an electronic device is top gate/bottom contact-type FET (specifically, TFT). As shown in a schematic partial sectional view of FIG. 2A, a field-effect transistor of Example 3 includes the following members:

($\alpha$) source/drain electrodes 16 (corresponding to the first and second electrodes) formed on a support 11;

($\beta$) a channel-forming region 17 (corresponding to the active layer) including a semiconductor thin film formed between the source/drain electrodes 16 on the support 11 (corresponding to the substrate);

($\gamma$) a gate insulating layer 15 (corresponding to the insulating layer) formed on the source/drain electrodes 16 and the channel-forming region 17; and ($\delta$) a gate electrode 14 (corresponding to the control electrode) formed on the gate insulating layer 15.

Outlines of the method for manufacturing an electronic device (semiconductor device) of Example 3 are described below.
Step-300

First, the source/drain electrodes 16 are formed on the support 11 (specifically, the insulating film 13) by the same method as in Step-120 of Example 1. Then, an inorganic semiconductor fine particle-dispersion solution is applied and dried on the substrate (specifically, the support 11 including the source/drain electrodes 16) to form a semiconductor fine particle layer by the same method as in Step-130 to Step-140 of Example 1. Then, the semiconductor fine particle layer is immersed in a solution (semiconductor thin film-forming solution) to form the channel-forming region (active layer) 17 including a semiconductor thin film.
Step-310

Next, the gate insulating layer 15 is formed by the same method as in Step-HO of Example 1. Then, the gate electrode 14 is formed on a portion of the gate insulating layer 15, which is disposed on the channel-forming region 17, by the same method as in Step-100 of Example 1.
Step-320

Finally, a passivation film (not shown) is formed over the entire surface to complete an electronic device of Example 3.

Example 4

Figure 2B:
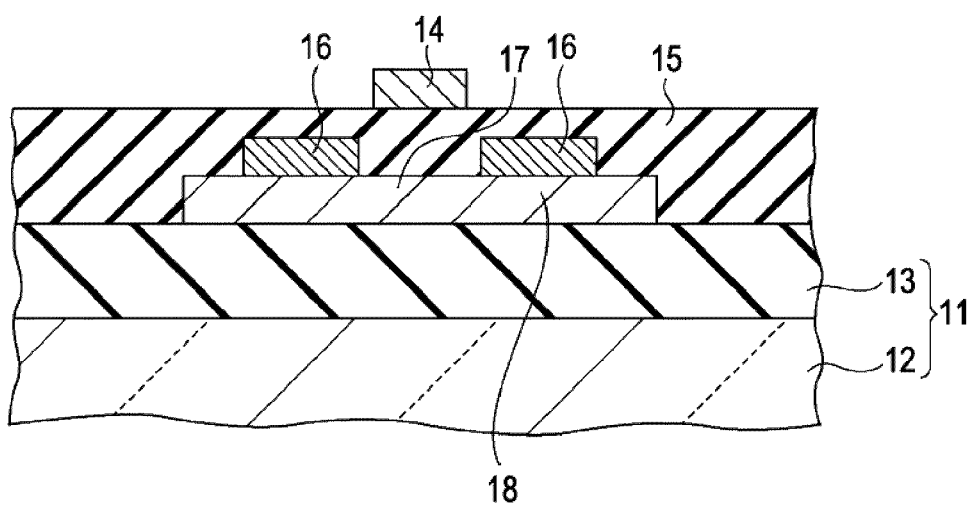

Example 4 is also a modification of Example 1. In Example 4, an electronic device is top gate/top contact-type FET (specifically, TFT). As shown in a schematic partial sectional view of FIG. 2B, a field-effect transistor of Example 4 includes the following members:

($\alpha$) a channel-forming region 17 (corresponding to the active layer) and a channel-forming region extension 18 including a semiconductor thin film formed on a support 11 (corresponding to the substrate);

($\beta$) source/drain electrodes 16 (corresponding to the first and second electrodes) formed on the channel-forming region extension 18;

($\gamma$) a gate insulating layer 15 (corresponding to the insulating layer) formed on the source/drain electrodes 16 and the channel-forming region 17; and ($\delta$) a gate electrode 14 (corresponding to the control electrode) formed on the gate insulating layer 15.

Outlines of the method for manufacturing an electronic device (semiconductor device) of Example 4 are described below.
Step-400

First, an inorganic semiconductor fine particle-dispersion solution is applied and dried on the substrate (specifically, the support 11) to form a semiconductor fine particle layer by the same method as in Step-130 to Step-140 of Example 1. Then, the semiconductor fine particle layer is immersed in a solution (semiconductor thin film-forming solution) to form the channel-forming region (active layer) 17 and the channel-forming region extension 18 including a semiconductor thin film.
Step-410

Next, the source/drain electrodes 16 are formed on the channel-forming region extension 18 by the same method as in Step-120 of Example 1.
Step-420

Then, the gate insulating layer 15 is formed by the same method as in Step-110 of Example 1. Then, the gate electrode 14 is formed on a portion of the gate insulating layer 15, which is disposed on the channel-forming region 17, by the same method as in Step-100 of Example 1.
Step-430

Finally, a passivation film (not shown) is formed over the entire surface to complete an electronic device of Example 4.

Example 5

Example 5 is also a modification of Example 1. An electronic device of Example 5 includes a light-emitting element (light-emitting transistor) in which light is emitted from an active layer by applying a voltage to a control electrode (the gate electrode 14) and first and second electrodes (the source/drain electrodes 16). Like in Example 1, the inorganic semiconductor fine particles used as a starting material of a semiconductor thin film which constitutes the active layer are composed of PbSe. Like in Example 1, the solution (semiconductor thin film-forming solution) is an ethyl alcohol solution of propanedithiol. Since the configuration and structure of the electronic device of Example 5 may be the same as those of the electronic devices described in Examples 1 to 4, detail description is omitted.

In the electronic device of Example 5, holes and electrons recombine in the active layer to emit fluorescent light depending on the state of voltage application to the control electrode and the first and second electrodes (the gate electrode 14 and the source/drain electrodes 16). The luminescent color depends on the state (bias) of voltage application to the first and second electrodes (the source/drain electrodes 16). Therefore, the luminescent color may be controlled by controlling the state (bias) of voltage application to the first and second electrodes (the source/drain electrodes 16). For example, when red light-emitting electronic devices, green light-emitting electronic devices, and blue light-emitting electronic devices are arranged based on, for example, delta arrangement, stripe arrangement, diagonal arrangement, or rectangle arrangement, color image display becomes possible. The electronic device may be allowed to function as a photoelectric transducer in which a current flows between the first and second electrodes (source/drain electrodes 16) by irradiation of the active layer. In this case, the device may be allowed to function as a solar cell by appropriately selecting the material constituting the first and second electrodes or function as an image sensor having different sensitivities to the three colors of red, green, and blue by optimizing the active layer.

Example 6

Figure 3:
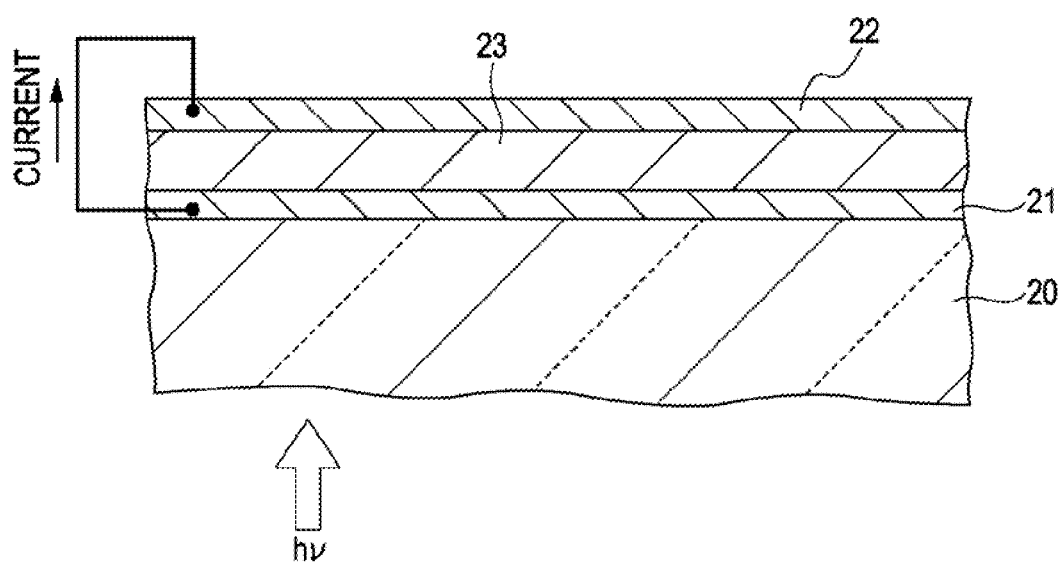
FIG. 3 is a schematic partial sectional view of an electronic device (semiconductor device) of Example 6.

Example 6 relates to the method for manufacturing an electronic device according to a second embodiment. As shown in a schematic partial sectional view of FIG. 3, an electronic device of Example 6 is a two-terminal electronic device including (A) a first electrode 21 and a second electrode 22, and (B) an active layer 23 including a semiconductor thin film provided between the first electrode 21 and the second electrode 22. Electric power is generated by irradiating the active layer 23 with light. That is, the electronic device of Example 6 functions as a solar cell. Alternatively, the electronic device functions as a light-emitting element in which the active layer 23 emits light by applying a voltage to the first electrode 21 and the second electrode 22.

Like in Example 1, in Example 6, the inorganic semiconductor fine particles used as a starting material of a semiconductor thin film which constitutes the active layer 23 are composed of PbSe. Namely, in Example 6, the inorganic semiconductor fine particles are composed of lead selenide (PbSe). Like in Example 1, the solution (semiconductor thin film-forming solution) is an ethyl alcohol solution of propanedithiol. The first electrode 21 is composed of a metal having high work function (specifically, a transparent electrode composed of ITO which transmits light), and the second electrode 22 is composed of a metal having low work function (specifically, aluminum (Al)).

In the electronic device of Example 6, in the active layer 23, an interfacial potential is present at a pn junction, and a barrier electric field is present. When the active layer 23 is irradiated with light through the first electrode 21 (or the second electrode 22 according to the constituent material), holes and electrons produced in the active layer are separated to produce a potential difference (photoelectromotive force). Since the second electrode 22 is composed of a metal having low work function, specifically aluminum (Al), electrons are easily injected into the second electrode 22. Therefore, in the electronic device of Example 6, when the active layer 23 is irradiated with light, electric power (photoelectromotive force) is generated. Alternatively, in the electronic device of Example 6, for example, when electrons are injected from the second electrode 22, and holes are injected from the first electrode 21 depending on the state of voltage application to the first electrode 21 and the second electrode 22, the electrons and holes immediately recombine to emit fluorescent light. When the electronic device of Example 6 is allowed to function as a light-emitting element, the electronic device does not have the above-described limitation, i.e., the limitation that the material constituting the first electrode 21 is a metal having high work function and the material constituting the second electrode 22 is a metal having low work function.

The first electrode 21 and the second electrode 22 may be composed of any material it is a material with conductivity. When the electronic device of Example 6 is manufactured, for example, the first electrode 21 composed of ITO is formed on a support 20 composed of an inorganic material such as glass or an organic polymer material such as polyimide or polyethylene terephthalate on the basis of the sputtering method. Then, a buffer layer (not shown) composed of PEDOT/PSS is formed on the first electrode 21, and the active layer 23 is formed on the buffer layer. Namely, an inorganic semiconductor fine particle-dispersion solution is applied and dried on the substrate (specifically, the buffer layer) to form a semiconductor fine particle layer, and then the semiconductor fine particle layer is immersed in a solution (semiconductor thin film-forming solution) to form the active layer 23 including a semiconductor thin film. Next, the second electrode 22 composed of aluminum is formed on the active layer 23 on the basis of the vacuum evaporation method. As a result, the electronic device of example 6 is obtained.

Figure 4A:
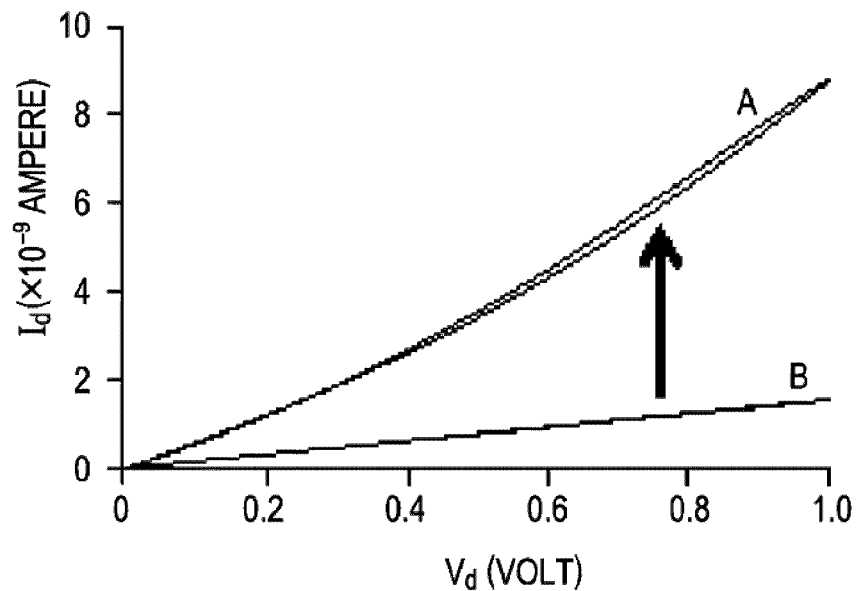
FIGS. 4A and 4B are a graph showing the results of measurement of electric conductivity of Sample A and Sample B obtained in Example 6 and a graph showing the results of measurement of photocurrent of Sample A.
Figure 4B:
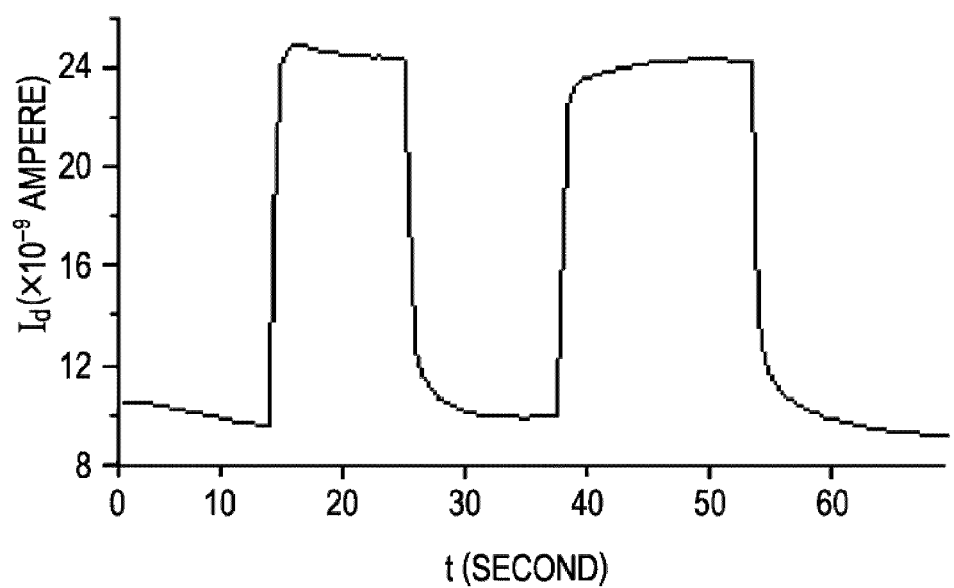

FIG. 4A shows the results of measurement of electric conductivity of a sample (sample B) prepared by applying and drying the inorganic semiconductor fine particle-dispersion solution on the substrate and a semiconductor thin film (sample A) prepared by applying and drying the inorganic semiconductor fine particle-dispersion solution on the substrate to form a semiconductor fine particle layer and then immersing the semiconductor fine particle layer in the solution (semiconductor thin film-forming solution). It is found that the conductivity of sample A is higher than that of sample B. FIG. 4B shows the results of measurement of photocurrent of sample A. The electric conductivity is increased by irradiating the semiconductor thin film with light, and the occurrence of photocurrent proves that the semiconductor thin film is semiconductive.

Although the present application is described on the basis of preferred examples, the present application is not limited to these examples. The structure and configuration, forming conditions, and manufacturing conditions of the electronic device the semiconductor device are examples and may be appropriately changed. When the electronic device obtained in the present application is applied to, for example, a display device and various electronic apparatuses, many electronic devices (semiconductor devices) may be integrated on the support or support member to produce a monolithic integrated circuit, or electronic devices (semiconductor devices) may be cut into individual devices and used as discrete components. In the electronic devices described in Examples 1 to 5, electric power is generated by irradiating the active layer with light. Therefore, the material constituting the active layer may be appropriately designed and selected so that one electronic device exhibits the functions as the three types of electronic devices, i.e., a photoelectric transducer including a solar cell, a transistor, and a light-emitting device.

A method for manufacturing a photoelectric conversion device is described as a reference example. That is, a photoelectric conversion device may be manufactured on the basis of the following:

(A) applying and drying an inorganic semiconductor fine particle-dispersion solution on a substrate to form a semiconductor fine particle layer; and (B) immersing the semiconductor fine particle layer in a solution containing molecules (referred to as "linker molecules") having two or more functional groups which adsorb on semiconductor fine particles.

Examples of the semiconductor fine particles include lead selenide, tin selenide, germanium selenide, cadmium selenide, zinc selenide, lead sulfide, tin sulfide, germanium sulfide, cadmium sulfide, zinc sulfide, lead telluride, tin telluride, germanium telluride, cadmium telluride, and zinc telluride. Photoresponsivity, photoelectric conversion function, photochromic function, the effect of suppressing the oxidation state between particles, and the like may be controlled by the linker molecules. Examples of the functional groups include —SH, —PO$_3$H$_2$, —COOH, and —NH$_2$. The two functional groups may be the same or different Specifically, for example, the same steps as Step-10 to Step-30 of Example 1 are performed to prepare an inorganic semiconductor fine particle-dispersion solution including a hexane/octane (9:1) solution in which about 1% by weight of inorganic semiconductor fine particles composed or PbSe and having protective layers of TOP formed on the surfaces thereof are dispersed. Next, the resulting inorganic semiconductor fine particle-dispersion solution is applied on a substrate including, for example, a glass substrate on the basis of the casting method and dried under the same conditions as in Step-130 to form a semiconductor fine particle layer. Then, unlike in Example 1, the semiconductor fine particle layer is immersed in an acetonitrile solution of propenedithiol or decanedithiol to substitute the protective films formed on the surfaces of the semiconductor fine particles with propanedithiol or decanedithiol. In Example 1, the ethyl alcohol solution of propenedithiol is used as the semiconductor thin film-forming solution, thereby forming a semiconductor thin film. On the other hand, when the acetonitrile solution is used, the semiconductor fine particle layer remains as it is without forming a semiconductor thin film. However, as described above, the protective films formed on the surfaces of the semiconductor fine particles constituting the semiconductor fine particle layer are substituted with propanedithiol or decanedithiol, resulting in linking of semiconductor particles with molecules (linker molecules) containing two or more functional groups.

A comb-like electrode composed of Au was formed on a glass substrate, and a semiconductor fine particle layer was formed on the glass substrate and the comb-like electrode by the above-described method of substituting the protective films formed on the surfaces of the semiconductor fine particles constituting the semiconductor fine particle layer with propanedithiol. FIG. 8 shows photoresponsivity before and after introduction of linker molecules (before and after immersion in an acetonitrile solution of propanedithiol). In FIG. 8, photoresponsivity before introduction of linker molecules is shown by "before linking", and photoresponsivity after introduction of linker molecules is shown by "after linking". FIG. 8 indicates that a current flowing through the comb-like electrode after introduction of linker molecules increases in response to light irradiation. However, photoresponsivity is not shown before introduction of linker molecules (refer to "before linking" in FIG. 8). When decanedithiol having a longer molecular length than that of propanedithiol was introduced, higher photoresponsivity than that of propanedithiol appeared. That is, it is found that responsivity may be controlled by controlling linker molecules. In addition, the absorption wavelength and light absorption efficiency of a photoelectric conversion device may be controlled according to the type and size of the semiconductor fine particles used and the type of linker molecules. Further, a new function may be imparted to a photoelectric conversion device by adding other functionality to linker molecules.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method for forming a semiconductor thin film comprising:
    applying an inorganic semiconductor fine particle-dispersion solution on a substrate and drying the coating to form a semiconductor fine particle layer;
    immersing the semiconductor fine particle layer in a solution to form a semiconductor thin film; and
    wherein the solution includes an alcohol containing a dithiol compound.

2. The method for forming a semiconductor thin film according to claim 1, wherein the inorganic semiconductor fine particles are composed of at least one material selected from the group consisting of lead selenide, tin selenide, germanium selenide, cadmium selenide, zinc selenide, lead sulfide, tin sulfide, germanium sulfide, cadmium sulfide, zinc sulfide, lead telluride, tin telluride, germanium telluride, cadmium telluride, and zinc telluride.

3. The method for forming a semiconductor thin film according to claim 1, wherein the dithiol compound is alkanedithiol, phenyldithiol, or thiophenedithiol.

4. A method for manufacturing an electronic device including a control electrode, a first electrode and a second electrode, and an active layer composed of a semiconductor thin film and provided between the first electrode and the second electrode so as to face the control electrode through an insulating layer,
    wherein the semiconductor thin film is formed by:
    applying an inorganic semiconductor fine particle-dispersion solution on a substrate to form a coating and drying the coating to form a semiconductor fine particle layer;
    immersing the semiconductor fine particle layer in a solution; and
    wherein the solution includes an alcohol containing a dithiol compound.

5. The method for manufacturing an electronic device according to claim 4, wherein the electronic device includes a field-effect transistor in which the control electrode corresponds to a gate electrode, the first and second electrodes correspond to source/drain electrodes, the insulating layer corresponds to a gate insulating layer, and the active layer corresponds to a channel-forming region.

6. The method for manufacturing an electronic device according to claim 4, wherein the inorganic semiconductor fine particles are composed of at least one material selected from the group consisting of lead selenide, tin selenide, germanium selenide, cadmium selenide, zinc selenide, lead sulfide, tin sulfide, germanium sulfide, cadmium sulfide, zinc sulfide, lead telluride, tin telluride, germanium telluride, cadmium telluride, and zinc telluride.

7. The method for manufacturing an electronic device according to claim 4, wherein the dithiol compound is alkanedithiol, phenyldithiol, or thiophenedithiol.

8. A method for manufacturing an electronic device including a first electrode and a second electrode, and an active layer composed of a semiconductor thin film and provided between the first electrode and the second electrode,
    wherein the semiconductor thin film is formed by:
    applying an inorganic semiconductor fine particle-dispersion solution on a substrate to form a coating and drying the coating to form a semiconductor fine particle layer;
    immersing the semiconductor fine particle layer in a solution; and wherein the solution includes an alcohol containing a dithiol compound.

9. The method for manufacturing an electronic device according to claim 8, wherein the inorganic semiconductor fine particles are composed of at least one material selected from the group consisting of lead selenide, tin selenide, germanium selenide, cadmium selenide, zinc selenide, lead sulfide, tin sulfide, germanium sulfide, cadmium sulfide, zinc sulfide, lead telluride, tin telluride, germanium telluride, cadmium telluride, and zinc telluride.

10. The method for manufacturing an electronic device according to claim 8, wherein the dithiol compound is alkanedithiol, phenyldithiol, or thiophenedithiol.

* * * * *